US009741406B2

(12) United States Patent
Kikuchi

(10) Patent No.: US 9,741,406 B2
(45) Date of Patent: *Aug. 22, 2017

(54) SEMICONDUCTOR MEMORY AND MEMORY SYSTEM

(71) Applicant: Renesas Electronics Corporation, Tokyo (JP)

(72) Inventor: Kazutaka Kikuchi, Kodaira (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/462,137

(22) Filed: Mar. 17, 2017

(65) Prior Publication Data

US 2017/0194042 A1    Jul. 6, 2017

Related U.S. Application Data

(63) Continuation of application No. 15/168,030, filed on May 28, 2016, now Pat. No. 9,613,668.

(30) Foreign Application Priority Data

Aug. 26, 2015  (JP) .................................. 2015-166486

(51) Int. Cl.
G11C 7/10    (2006.01)
G11C 7/22    (2006.01)

(52) U.S. Cl.
CPC .................. *G11C 7/22* (2013.01); *G11C 7/10* (2013.01); *G11C 7/1006* (2013.01)

(58) Field of Classification Search
CPC ................................................. G11C 7/1006
(Continued)

(56) References Cited

U.S. PATENT DOCUMENTS 4,799,198 A      1/1989   Ogawa
2006/0067123 A1* 3/2006   Jigour .................. G11C 7/1045
                                                          365/185.05
(Continued)

FOREIGN PATENT DOCUMENTS

JP         2005-235248 A      9/2005

OTHER PUBLICATIONS

United States Notice of Allowance dated Dec. 2, 2016 in U.S. Appl. No. 15/168,030.
(Continued)

*Primary Examiner* — Huan Hoang
*Assistant Examiner* — Jay Radke
(74) *Attorney, Agent, or Firm* — McGinn IP Law Group, PLLC

(57) ABSTRACT

A semiconductor memory, including: a plurality of data terminals for transmitting data; a plurality of buffer circuits, each being coupled to a corresponding one of the data terminals; and a control circuit receiving an access command, that controls reading data from a memory cell array or writing data to the memory cell array, and a terminal setting information issued with each access command, and controlling the buffer circuits based on the access command and the terminal setting information, wherein, when the terminal setting information indicates a first mode, all of the buffer circuits function as input buffer circuits or output buffer circuits based on the access command, and wherein, when the terminal setting information indicates a second mode, a part of the buffer circuits functions as the input buffer circuits and a remaining part of the buffer circuits functions as the output buffer circuits.

7 Claims, 15 Drawing Sheets

(58) Field of Classification Search
USPC .......... 365/189.03, 189.04, 189.17, 189.18, 365/189.19
See application file for complete search history.

(56) References Cited

U.S. PATENT DOCUMENTS

| | | |
|---|---|---|
| 2007/0189083 A1 | 8/2007 | Kim |
| 2009/0187680 A1* | 7/2009 | Liao .................... G06F 13/4086 710/31 |
| 2011/0188330 A1 | 8/2011 | Matsushige |
| 2017/0062026 A1* | 3/2017 | Kikuchi ................. G11C 7/22 |

OTHER PUBLICATIONS

United States Ex Parte Quayle Action dated Sep. 20, 2016, in U.S. Appl. No. 15/168,030.

* cited by examiner

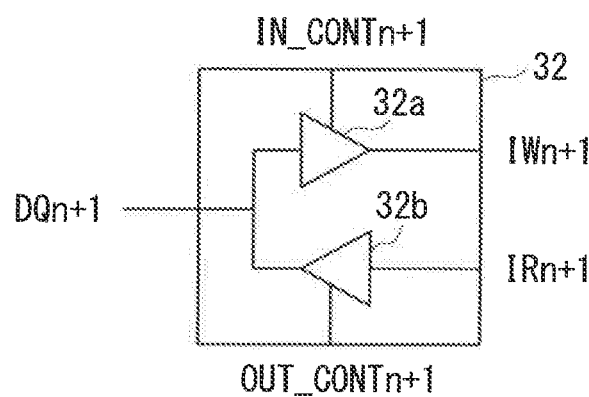
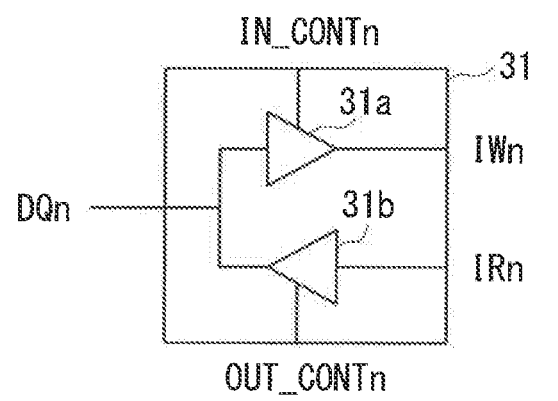
Fig. 3

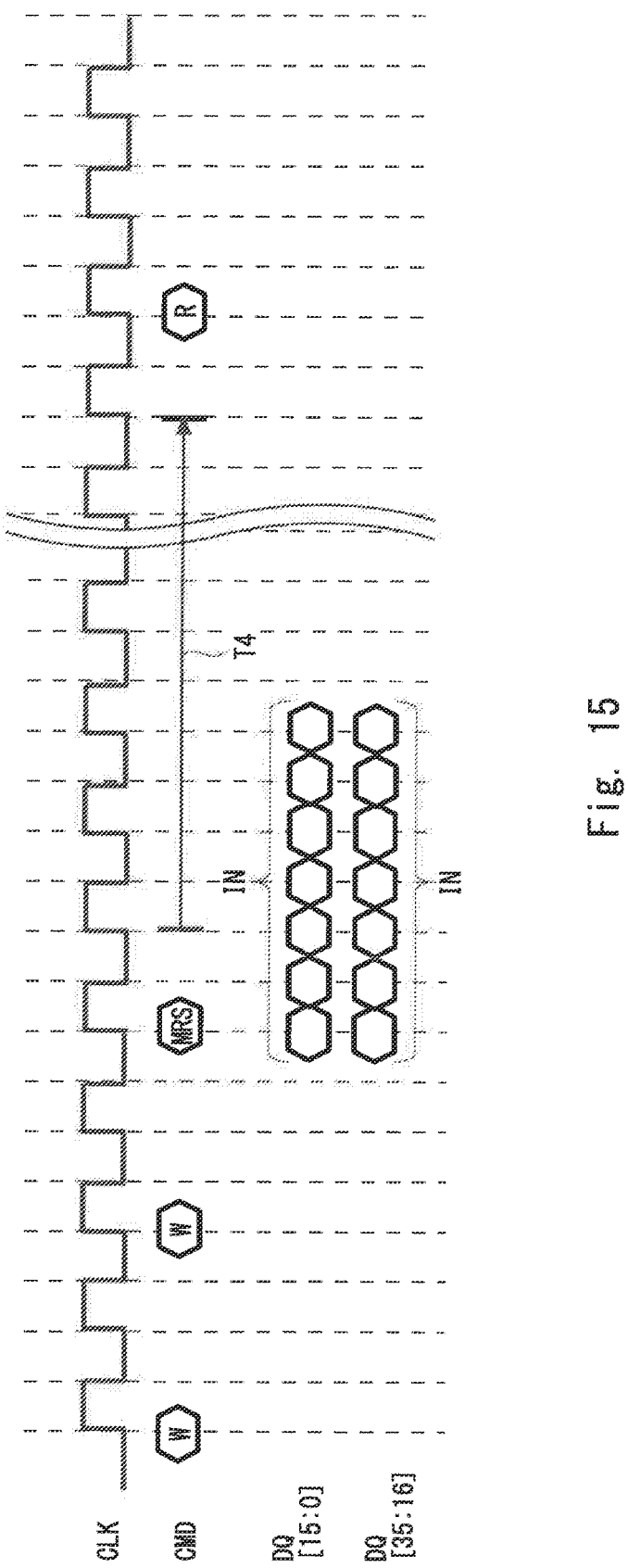

SEMICONDUCTOR MEMORY AND MEMORY SYSTEM

CROSS-REFERENCE TO RELATED APPLICATIONS

This application is a Continuation Application of U.S. application Ser. No. 15/168,030, filed on May 28, 2016, which is based upon and claims the benefit of priority from Japanese patent application No. 2015-166486, filed on Aug. 26, 2015, the disclosure of which is incorporated herein in its entirety by reference.

BACKGROUND

The present invention relates to a semiconductor memory and a memory system, and relates to, for example, a semiconductor memory capable of selecting a separate IO (SIO) mode and a common IO (CIO) mode when data is input or output and a memory system using this semiconductor memory.

A data input/output mode of a semiconductor memory includes a common IO mode (hereinafter it will be referred to as a CIO mode) in which input or output of data is performed using a common terminal (common IO) and a separate IO mode (hereinafter it will be referred to as an SIO mode) in which input or output of data is performed using a separate IO including a terminal dedicated for inputting data (dedicated input terminal) and a terminal dedicated for outputting data (dedicated output terminal). Japanese Unexamined Patent Application Publication No. 2005-235248 (Patent Literature 1) discloses a semiconductor memory capable of switching the CIO mode and the SIO mode according to a mode control signal.

SUMMARY

Since it is required to provide time intervals between the commands (provide a data turnaround) in the CIO mode to avoid collision of input data and output data on a data bus when reading and writing are switched, the efficiency in the data bus is degraded. In a network system, in particular, the influence of the data turnaround is quite serious since it is required to increase the speed of the memory clock and to reduce the latency in the network system.

Although the problem regarding the data turnaround does not occur in the SIO mode, when the number of bits of data is large, the number of lines formed between a memory and a host is increased in order to maintain a bus bandwidth the same as that in the CIO mode, whereby the area of the semiconductor memory increases.

In the above semiconductor memory, which one of the CIO mode and the SIO mode is preferably used varies according to a status of access. When access commands are successive read commands, for example, the CIO mode in which the number of external terminals used to input or output data becomes a maximum is preferably used in order to increase the transfer speed. On the other hand, when the ratio of the read request to the write request of the access commands is close to each other, the SIO mode is preferably used since the efficiency in the data bus is degraded due to the data turnaround provided in the CIO mode.

While the technique for switching the CIO mode and the SIO mode is disclosed in Patent Literature 1, the modes are switched according to an inspection item of a Direct Memory Access (DMA) test and the status of the access to the semiconductor memory is not considered. Therefore, in the semiconductor memory disclosed in Patent Literature 1, it is impossible to improve the efficiency in the data bus depending on the status of the access.

The other problems of the related art and the novel characteristics of the present invention will be made apparent from the descriptions of the specification and the accompanying drawings.

According to one embodiment, a semiconductor memory includes a plurality of input/output terminals that can be switched between a plurality of common input/output terminals and a plurality of separate input/output terminals, in which it is switched, based on input/output terminal setting information issued with each access command, which one of the common input/output terminals and the separate input/output terminals should be used to transmit data read out from a memory cell or data written to the memory cell according to the access command for each command cycle.

According to the embodiment, it is possible to improve the efficiency in the data bus according to the status of access of the semiconductor memory.

BRIEF DESCRIPTION OF THE DRAWINGS

The above and other aspects, advantages and features will be more apparent from the following description of certain embodiments taken in conjunction with the accompanying drawings, in which:

FIG. 3 is a diagram showing a configuration of a tri-state buffer circuit of the I/F circuit shown in FIG. 2;

FIG. 15 is a timing chart of the memory access when modes are changed by an MRS command when the read command and the write command are alternately input after write commands are successively input in the semiconductor memory according to the comparative example.

DETAILED DESCRIPTION

For the clarification of the description, the following description and the drawings may be omitted or simplified as appropriate. The specific numerical values and the like shown in the following embodiments are merely examples to facilitate understanding of the embodiments and are not limited thereto unless otherwise specified. Throughout the drawings, the same components are denoted by the same reference symbols and overlapping descriptions will be omitted as appropriate.

The embodiments relate to a semiconductor memory capable of selecting a separate IO (SIO) mode and a common IO (CIO) mode when data is input or output and a memory system using this semiconductor memory. The semiconductor memory includes an input/output terminal that can be switched between a common input/output terminal and a separate input/output terminal.

In the embodiments, input/output terminal setting information is input for each access command (read command/write command). By switching the separate IO (SIO) mode and the common IO (CIO) mode for each command cycle in accordance with the timing of inputting or outputting of data according to the access command based on the input/output terminal setting information, the efficiency in the data bus can be improved.

In a memory access in which a user frequently switches the read command and the write command, the SIO mode in which the data turnaround does not occur is selected. On the other hand, in the memory access in which the identical commands (read or write) are successive, the CIO mode in which all the bus areas can be used in one direction is selected. This embodiment can be applied, for example, to a memory, a memory controller, and a memory system (in particular, a low latency memory for a network (e.g., low latency dynamic random access memory (LLDRAM)) including a parallel interface (I/F).

Hereinafter, with reference to the drawings, embodiments will be described.

First Embodiment

Figure 1:
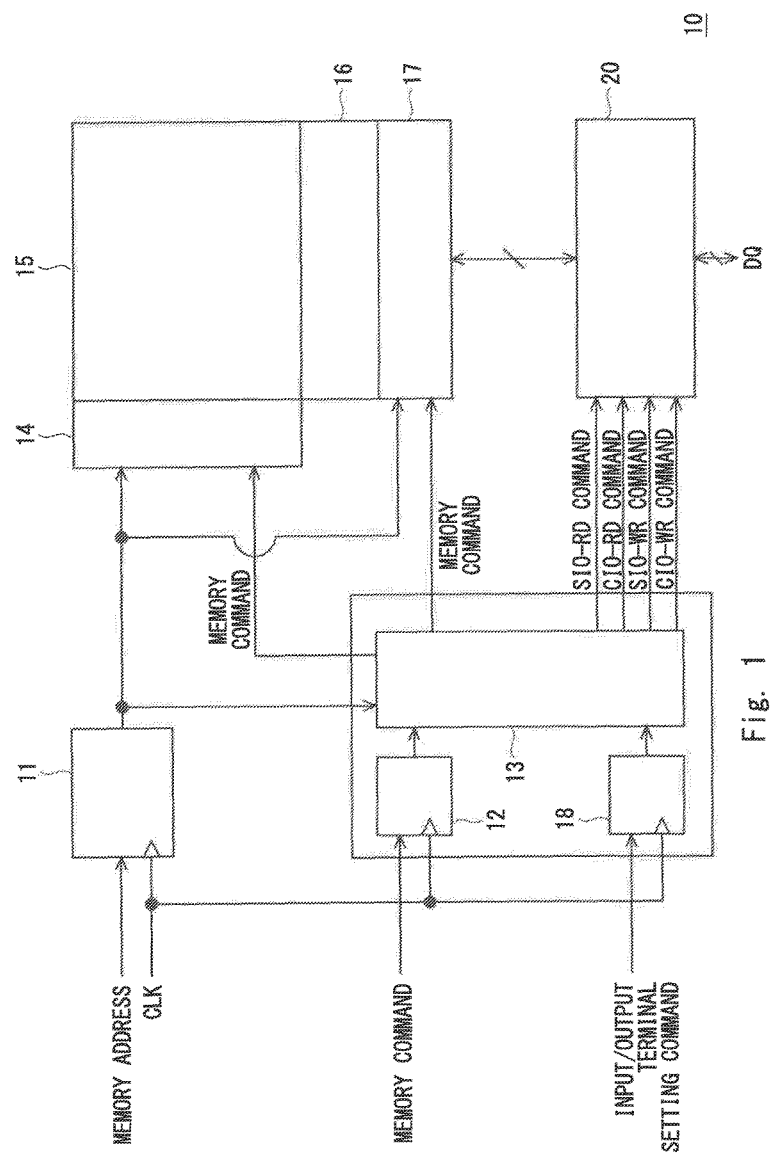
FIG. 1 is a diagram showing a configuration of a semiconductor memory according to a first embodiment.

With reference to FIG. 1, a semiconductor memory according to a first embodiment will be described. FIG. 1 is a diagram showing a configuration of a semiconductor memory 10 according to the first embodiment. As shown in FIG. 1, the semiconductor memory 10 includes an address register 11, a register 12, a logic circuit 13, a row decoder 14, a memory cell core 15, a sense amplifier 16, a column decoder 17, a register 18, and an I/F circuit 20.

Here, an example in which a memory cell is a dynamic random access memory (DRAM) memory cell will be described. The memory cell core 15 includes an electrically rewritable memory cell array (not shown), word lines (not shown), and bit lines (not shown). In the memory cell array, a plurality of memory cells (not shown) are arranged in a matrix. The word lines are arranged so that they correspond to the respective rows and are connected to the memory cells of the respective rows. The bit lines are arranged so that they correspond to the respective columns and are connected to the memory cells of the respective columns. The memory cell may be a static random access memory (SRAM) memory cell, a FLASH memory cell or the like.

The address register 11 latches a memory address that is externally input by an external clock CLK. The memory address includes a row address to select the word line of the memory cell array and a column address to select the bit line of the memory cell array. The memory address latched by the address register 11 is input to the logic circuit 13, the row decoder 14, and the column decoder 17.

The register 12 latches a memory command that is externally input by the external clock CLK. In the case of the DRAM, the memory command includes a write command, a read command, and a refresh command. In this example, the write command and the read command are access commands. The memory command latched by the register 12 is input to the logic circuit 13.

The logic circuit 13 specifies the operation mode of the memory cell core 15 according to the memory command input from the register 12. In the case of the DRAM, in the memory cell core 15, one of a write mode, a read mode, and a refresh mode is selected. The logic circuit 13 controls, for example, the operation timing of each circuit, the operation of each circuit in the reading operation, the operation of each circuit in the writing operation, and the operation of each circuit in the refresh operation.

The row decoder 14 selects the word line of the memory cell core 15 according to the row address that is input. In the case of the read mode, the column decoder 17 selects the bit line of the memory cell core 15 according to the column address that is input. The sense amplifier 16 amplifies the data of the bit line that has been selected. The data amplified by the sense amplifier 16 is output to an external device via the bit line selected in the column decoder 17 and the I/F circuit 20. Further, in the case of the refresh operation of the DRAM, the selection of the bit line in the column decoder 17 is unnecessary. Therefore, the logic circuit 13 stops the operation of selecting the bit line in the column decoder 17.

The I/F circuit 20 includes an input/output terminal DQ that can be switched between a common input/output terminal capable of bidirectionally transmitting data and a separate input/output terminal including a dedicated input terminal that receives data and a dedicated output terminal that outputs data. That is, the I/F circuit 20 is an input/output circuit in which the CIO mode and the SIO mode can be switched.

Besides the memory command latched by the register 12, an input/output terminal setting command is input to the register 18 from the outside for each memory command. The input/output terminal setting command is input/output terminal setting information specified by a user that switches the input/output terminal DQ of the I/F circuit 20 to one of the common input/output terminal and the separate input/output terminal. In the first embodiment, the input/output terminal setting command is input at the same time that the access command (read command/write command) is input for each access command. The register 18 receives the input/output terminal setting command by the external clock CLK for each command cycle. The register 18 outputs the input/output terminal setting command that has been latched to the logic circuit 13.

Further, the logic circuit 13 switches the input/output terminal DQ to one of the common input/output terminal and the separate input/output terminal when the read or write data according to the access command is input or output based on the access command input from the register 12 and the input/output terminal setting command input from the register 18.

Specifically, the logic circuit 13 controls the I/F circuit 20 by any one of the following four operation control signals. The four operation control signals include a read operation control signal in the separate IO mode (hereinafter it will be referred to as an SIO-RD command), a write operation control signal in the separate IO mode (hereinafter it will be referred to as an SIO-WR command), a read operation control signal in the common IO mode (hereinafter it will be referred to as a CIO-RD command), and a write operation control signal in the common IO mode (hereinafter it will be referred to as a CIO-WR command).

Figure 2:
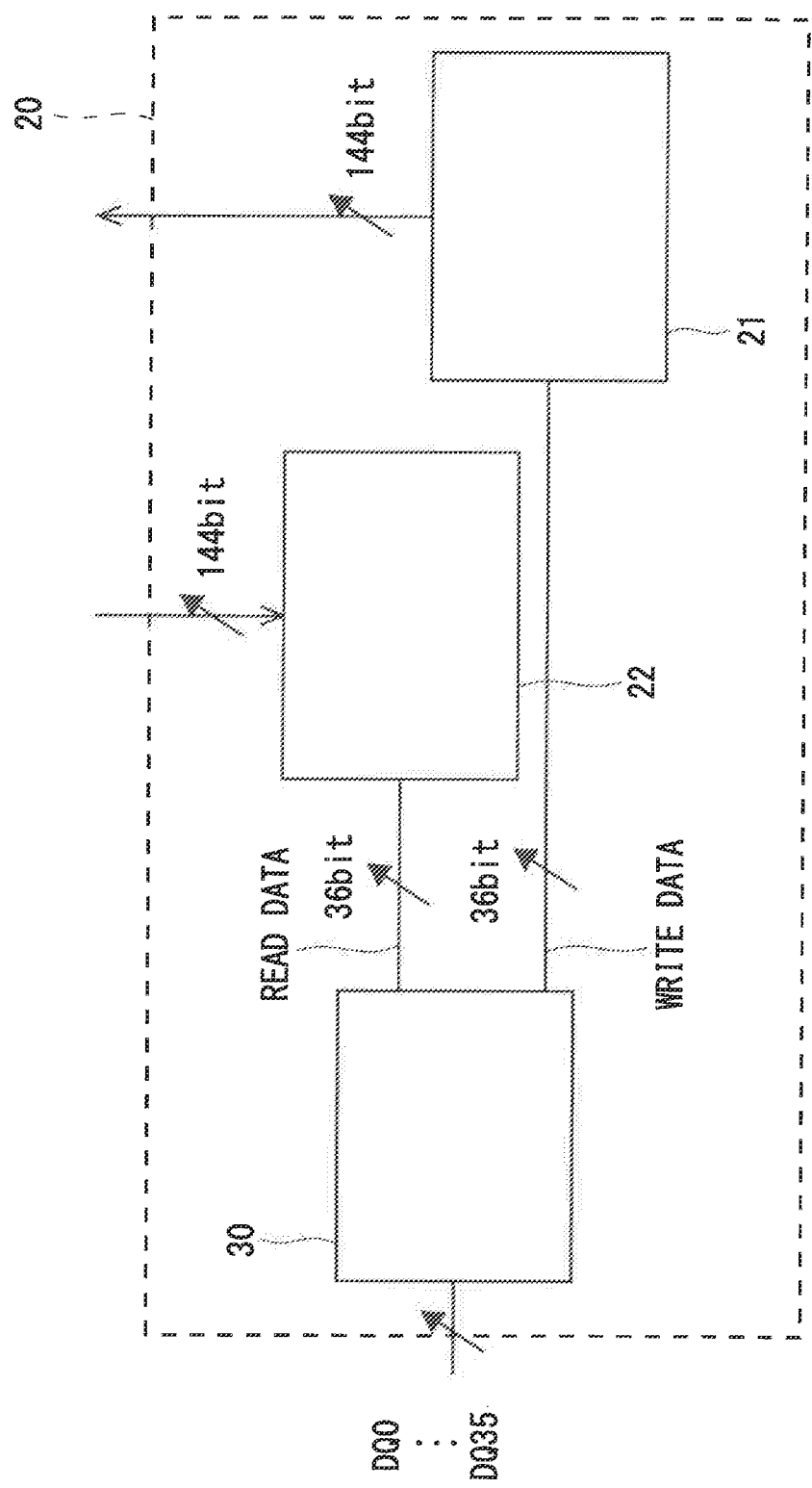
FIG. 2 is a diagram showing a configuration of an I/F circuit of the semiconductor memory shown in FIG. 1.

FIG. 2 shows one example of the configuration of the I/F circuit 20. The I/F circuit 20 includes data converter circuits 21 and 22 and a tri-state buffer circuit 30. The data converter circuits 21 and 22 parallel/serial convert the read data when data is read out and serial/parallel convert the write data when data is written. That is, in the CIO mode, both of the data converter circuits 21 and 22 are used for both the writing and the reading. On the other hand, in the SIO mode, the data converter circuit 21 is a circuit dedicated for the writing and the data converter circuit 22 is a circuit dedicated for the reading. FIG. 2 shows a state in which the data converter circuit 21 is used as a serial/parallel converter circuit for writing and the data converter circuit 22 is used as a parallel/serial converter circuit for reading in the SIO mode.

In FIG. 2, when data is written, the write data input according to the specification of the I/F circuit 20 from the tri-state buffer circuit 30 is converted into the number of bits selected by the column decoder 17 by the data converter circuit 21 and the converted data is transferred to the memory cell core 15. When data is read out, the read data selected and output by the column decoder 17 is converted into the specification of the I/F circuit 20 by the data converter circuit 22 and the converted data is output via the tri-state buffer circuit 30.

It is assumed, for example, that the specification of the I/F circuit 20 is a Double-Data-Rate (DDR) method, the burst length (hereinafter it will be referred to as a BL) being 2, and the number of input/output terminals being 36 (input/output terminals DQ0 to DQ35). In the DDR method, data input/output is determined at a rising and a falling of an external clock. In the read operation, when the bit width of the read data is 144 bits, the data converter circuit 22 divides the 144-bit read data into 36 bits and four columns.

The tri-state buffer circuit 30 outputs 36-bit read data in the first column at the first rise edge of the external clock and outputs 36-bit read data in the second column at the first fall edge. After that, the tri-state buffer circuit 30 outputs 36-bit read data in the third column at the second rise edge of the external clock and outputs 36-bit read data in the fourth column at the second fall edge. A description of the write operation will be omitted since the data converter circuit 21 is used in the write operation as well and the description given above can be also applied to the description of the write operation when the term "output" is changed to the term "input".

FIG. 3 shows one example of a configuration of the tri-state buffer circuit 30. In the example shown in FIG. 3, the tri-state buffer circuit 30 includes a tri-state buffer 31 including an input/output terminal DQn and a tri-state buffer 32 including an input/output terminal DQn+1. The tri-state buffer 31 includes a receiver circuit 31a and a buffer circuit 31b. The tri-state buffer 32 includes a receiver circuit 32a and a buffer circuit 32b.

The receiver circuit 31a transfers the write data input from the input/output terminal DQn to a write output terminal IWn. The buffer circuit 31b outputs the read data input from an input terminal IRn to the input/output terminal DQ. Since the configuration of the tri-state buffer 32 is similar to that of the tri-state buffer 31, a description thereof will be omitted.

In the write operation in the common IO mode (hereinafter it will be referred to as a CIO-WR mode), the state of the receiver circuits 31a and 32a is set to an active state by control signals input from IN_CONTn and IN_CONTn+1. The write data input from the input/output terminals DQn and DQn+1 is respectively output from the output terminals TWn and TWn+1. At this time, the buffer circuits 31b and 32b output HI-Z by control signals input from OUT_CONTn and OUT_CONTn+1, whereby data collision is avoided.

In the read operation in the common IO mode (hereinafter it will be referred to as a CIO-RD mode), different from the CIO-WR mode stated above, the receiver circuits 31a and 32a are stopped and the state of the buffer circuits 31b and 32b is controlled to the active state. The read data input from the input terminals IRn and IRn+1 is output from the input/output terminals DQn and DQn+1.

In the SIO mode, for example, half of the input/output terminals of the tri-state buffer circuit 30 become dedicated input terminals to receive data and the other half of the input/output terminals thereof become dedicated output terminals. In the example shown in FIG. 3, the input/output terminal DQn becomes the dedicated input (write) terminal and the input/output terminal DQn+1 becomes the dedicated output (read) terminal.

In the write operation in the separate IO mode (hereinafter it will be referred to as an SIO-WR mode), the receiver circuit 31a is set to the active state by the control signal input from IN_CONTn. The write data input from the input/output terminal DQn is output from the output terminal IWn. At this time, the operation of the buffer circuit 31b is stopped by the control signal input from OUT_CONTn. Further, the receiver circuit 32a of the tri-state buffer 32 is stopped by the control signal input from IN_CONTn+1. The buffer circuit 32b of the tri-state buffer 32 may be set either to the active state or the stop state according to the specification of the tri-state buffer circuit 30.

In the read operation in the separate IO mode (hereinafter it will be referred to as an SIO-RD mode), the buffer circuit 32b is set to the active state by the control signal input from OUT_CONTn+1. The read data input from the input terminal IRn+1 is output from the input/output terminal DQn+1. At this time, the operation of the receiver circuit 32a is stopped by the control signal input from IN_CONTn+1. Further, the buffer circuit 31b of the tri-state buffer 31 is stopped by the control signal input from OUT_CONTn. The receiver circuit 31a of the tri-state buffer 31 may be set either to the active state or the stop state according to the specification of the tri-state buffer circuit 30.

The respective control signals input from IN_CONTn, IN_CONTn+1, OUT_CONTn, and OUT_CONTn+1 of the tri-state buffer circuit 30 are generated based on the SIO-RD command, the SIO-WP command, the CIO-RD command, and the CIO-WR command output from the logic circuit 13 for each access command.

Figure 4:
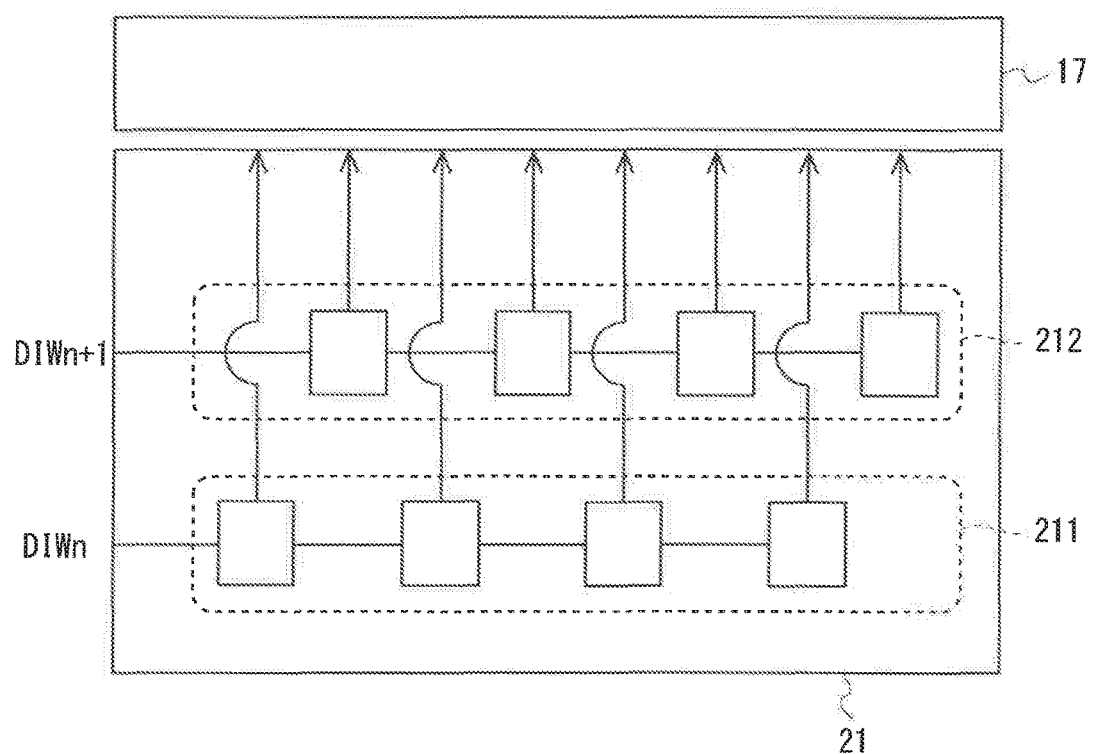
FIG. 4 is a diagram showing a configuration of a data converter circuit of the I/F circuit shown in FIG. 2.

FIG. 4 is a diagram showing one example of a configuration of the data converter circuit 21. As shown in FIG. 4, the data converter circuit 21 includes latch circuits 211 and 212. The latch circuits 211 and 212 are a series of latch circuits that receive the write data transferred from the tri-state buffer circuit 30 at the rise edge and the fall edge of the clock CLK. In FIG. 4, the write data output from the output terminal IWn of the tri-state buffer 31 is denoted by DIWn and the write data output from the output terminal. IWn+1 of the tri-state buffer 32 is denoted by DIWn+1.

In the example shown in FIG. 4, the specification of the I/F circuit 20 is BL4. The data converter circuit 22 includes a configuration the same as that of the data converter circuit 21. The latch circuits 211 and 212 are shift registers each including four registers connected in series.

In the CIO-WR mode, the write data DIWn is successively transferred among the registers in the latch circuit 211 and the write data DIWn+1 is successively transferred among the registers in the latch circuit 212. At the time that the write data DIWn and DIWn+1 have been input to all the registers of the latch circuits 211 and 212, the write data DIWn and DIWn+1 are transferred to the memory cell core based on the selection by the column decoder 17. At this time, the latch circuits 211 and 212 are controlled by the CIO-WR command output from the logic circuit 13.

In the SIO-WR mode, only DIWn is input and DIWn+1 is not input. Therefore, only the write data DIWn is successively transferred among the registers in the latch circuit 211. At this time, the latch circuit 212 stops the latch operation. At the time that the write data DIWn has been input to all the registers of the latch circuit 211, the write data DIWn is transferred to the memory cell core based on the selection by the column decoder 17. At this time, the latch circuits 211 and 212 are controlled by the SIO-WR command output from the logic circuit 13.

In the CIO-RD mode and the SIO-RD mode, the direction in which the read data in the data converter circuit 21 is transferred is opposite to the direction in which the write data is transferred. Therefore, a detailed description of a case in which the read data is transferred will be omitted.

Figure 13:
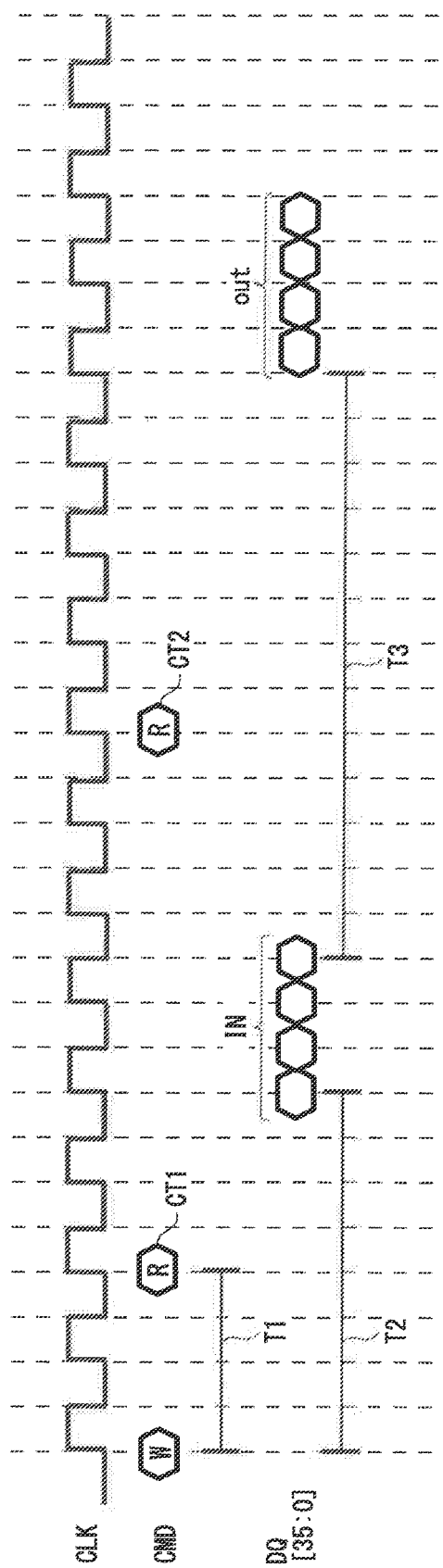
FIG. 13 is a timing chart of a memory access when a write command is switched to a read command in a semiconductor memory according to a comparative example.

Before describing an operation of the semiconductor memory 10 according to this embodiment, an operation of a semiconductor memory according to a comparative example will be described first for facilitating understanding of the present invention. FIG. 13 is a timing chart of the memory access when the write command is switched to the read command in the semiconductor memory in which only the CIO is included and switching between the CIO mode and the SIO mode cannot be performed.

In FIG. 13, CLK indicates the clock, CMD indicates the memory command, and DQ[35:0] indicates data input or output from each input/output terminal. The symbol W of the memory command indicates the write command and the symbol R indicates the read command.

T1 indicates a command cycle. The command cycle means a cycle of the period from the time that the first command is input to the time that the next command can be input. The command cycle is normally defined by a data sheet or the like. In FIG. 13, as one example, T1=two cycles.

T2 indicates a latency. The latency is a period from the time that the command is input to the time that the data corresponding to this command is output from or input to the input/output terminal. In the example shown in FIG. 13, T2=four cycles. Therefore, the write data is input four clocks after the first write command W is input. While the example in which the command cycle is T1 and the latency is T2 for the write command W is shown in FIG. 13, the command cycle T1 and the latency T2 for the read command R are also defined by a data sheet or the like.

T3 indicates a data turnaround period. In the CIO mode, both the transfer of the data from the memory to the host (e.g., central processing unit (CPU), application specific integrated circuit (ASIC)) and the transfer of the data from the host to the memory are performed by one data bus. When the memory and the host concurrently output data, a data collision occurs on the data bus, which may cause a malfunction of the system.

Therefore, as shown in FIG. 13, when the memory is switched from the write mode to the read mode, the data turnaround T3 needs to be set. While the data turnaround in the memory is defined in the data sheet or the like, in an actual system, a value obtained by adding a delay between the memory and the host to the data turnaround of the memory is set as the data turnaround of the system. In the example shown in FIG. 13, T3=six cycles.

In the timing chart of FIG. 13, if there is no data turnaround, the read command R is preferably input at a timing indicated by CT1, which is the timing after an elapse of the command cycle T1 after the write command W is input. However, considering the data turnaround T3, the read command R cannot be input until the timing indicated by CT2. Therefore, the data bus efficiency is degraded.

Figure 14:
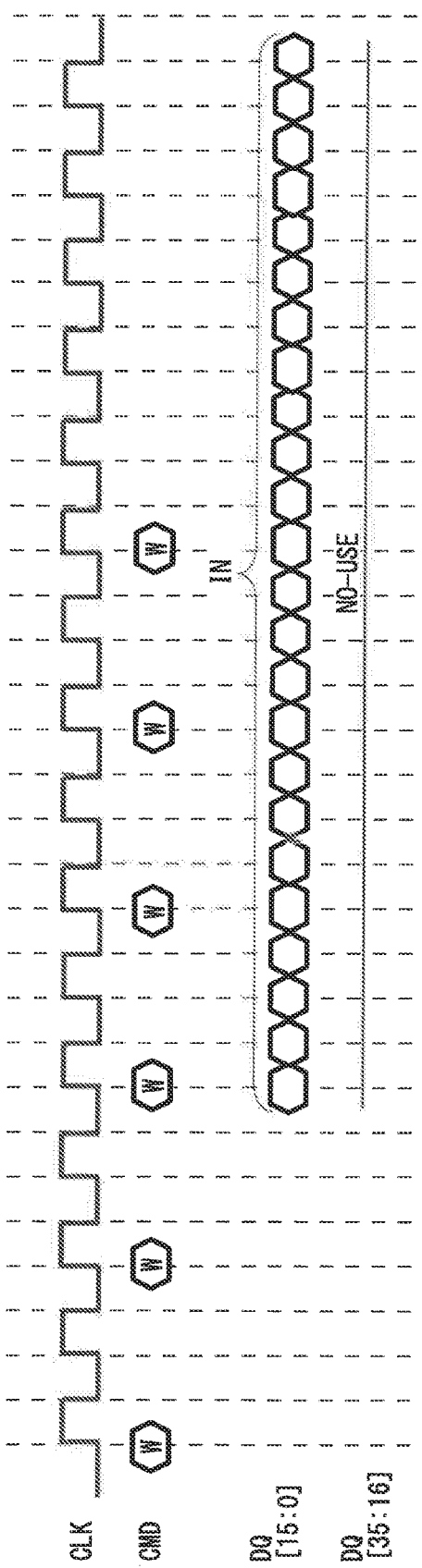
FIG. 14 is a timing chart of the memory access when write commands are successive in the semiconductor memory according to the comparative example.

FIG. 14 is a diagram for describing a memory access when the write commands are successive in a semiconductor memory in which only the SITO is included and switching between the CIO mode and the SIO mode cannot be performed. In the example shown in FIG. 14, the input/output terminals DQ0 to DQ15 are set to terminals dedicated for transferring data from the host to the memory (writing) and the input/output terminals DQ16 to DQ35 are set to terminals dedicated for transferring data from the memory to the host (reading).

In this case, the data turnaround, which is the problem occurring in the CIO mode, does not occur since there is no change in the data transfer direction. However, when the write commands are successively input as shown in FIG. 14, only the input/output terminals DQ0 to DQ15 are used and DQ16 to DQ35 are not used. Therefore, the data bus efficiency in the SIO mode falls to become 50% less than the data bus efficiency in the CIO mode. That is, in the memory access shown in FIG. 14, in the SIO mode, it is required to input twice as many commands as those in the CIO mode to write the same number of bits of data.

As described above, which one of the CIO mode and the SIO mode is preferable varies according to the status of access to the memory. That is, when identical access commands are successively input, the CIO mode is preferably used. On the other hand, when the read request and the write request of the access command are frequently switched, the SIO mode is preferably used.

As stated above, in Patent Literature 1, the status of the access to the memory cell is not considered, the mode control signal is set in advance, and the CIO mode and the SIO mode are switched by asserting or negating the mode control signal. It is therefore impossible to switch the CIO mode and the SIO mode according to the status of the access to the memory cell.

Figure 5:
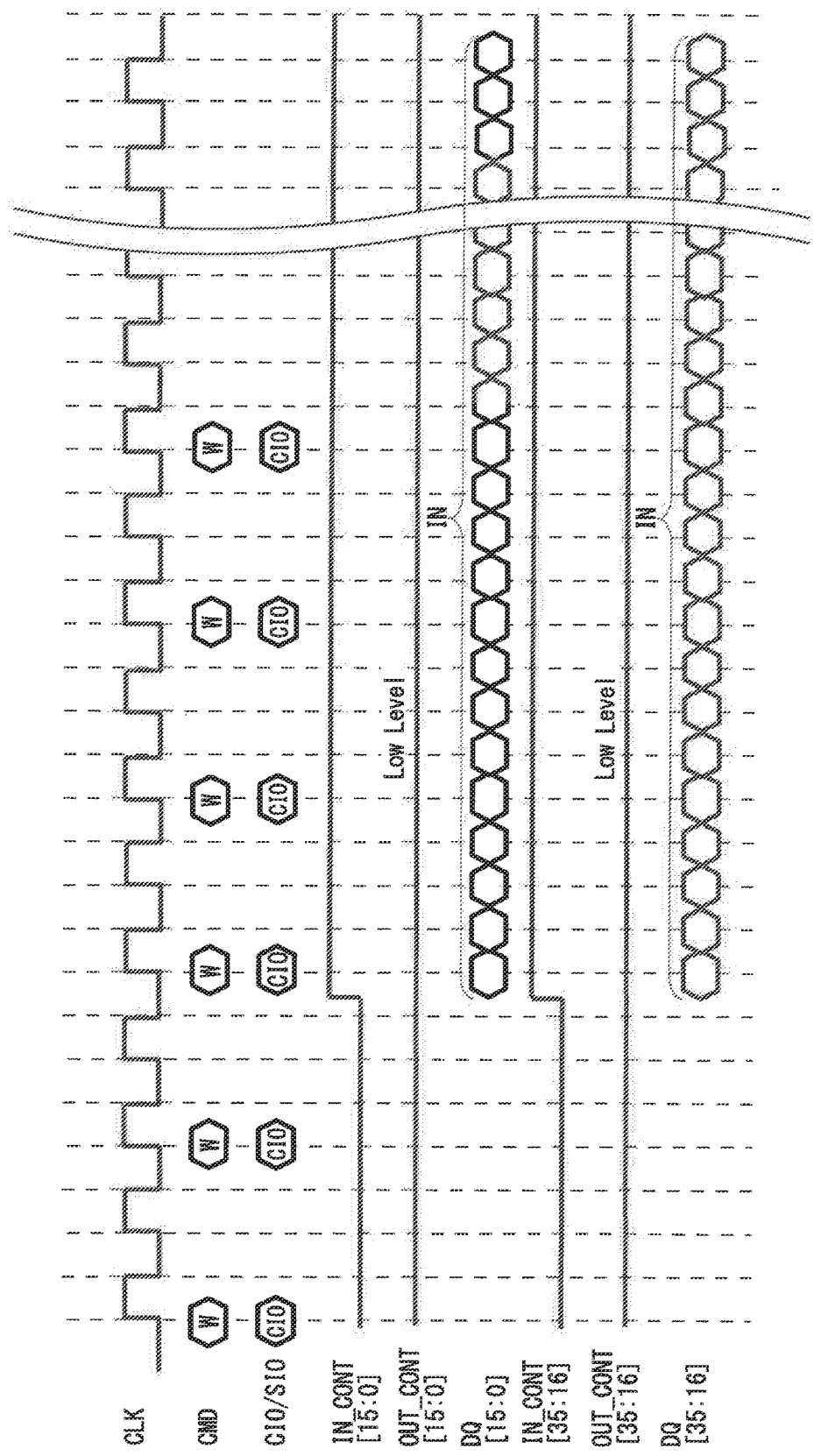
FIG. 5 is a diagram showing one example of a timing chart of a memory access when write commands are successive in the semiconductor memory according to the first embodiment.

An operation of the semiconductor memory 10 according to the first embodiment will now be described. FIG. 5 is a diagram showing one example of a timing chart of the memory access when the write commands W are successive in the semiconductor memory 10. In FIG. 5, the CIO/SIO indicates an input terminal setting command. The CIO command is an input terminal setting command that sets the I/F circuit 20 to the CIO mode. The SIO command is an input terminal setting command that sets the I/F circuit 20 to the SIO mode.

IN_CONT[15:0] and the OUT_CONT[15:0] are switch control signals that switch whether to input data to the input/output terminal DQ[15:0] or to output data from the input/output terminal DQ[15:0]. IN_CONT[35:16] and OUT_CONT[35:16] are switch control signals that switch whether to input data to the input/output terminal DQ[35:16] or to output data from the input/output terminal DQ[35:16].

As described above, when the write commands W are successive, it is preferable that the CIO mode be selected. In this case, the user inputs the CIO command at the same time that the write command W is input for each write command W. Therefore, the write data is input from both the input/output terminal DQ[15:0] and the input/output terminal DQ[35:16]. As described above, the input terminal setting command is input at the same time that the access command is input, whereby it is possible to appropriately switch the CIO code and the SIO mode for each command cycle when data is input or output in response to the access command. The data bus efficiency shown in FIG. 5 is equal to the data bus efficiency when the identical access commands are successive in the semiconductor memory in which only the CIO mode is included.

Figure 6:
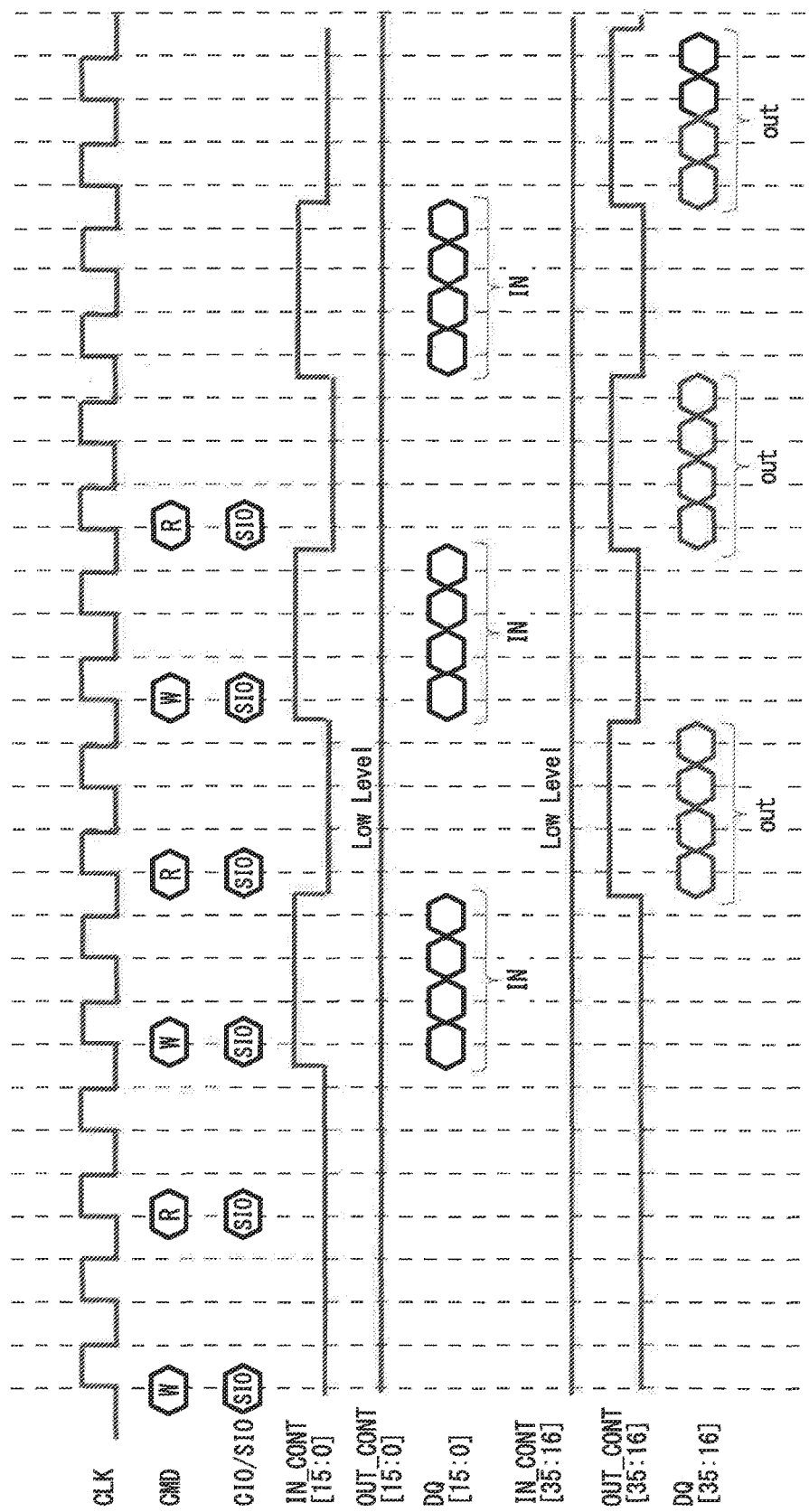
FIG. 6 is a diagram showing one example of a timing chart of the memory access when a read command and a write command are alternately input in the semiconductor memory according to the first embodiment.

Next, the operation of the semiconductor memory 10 when the write command W and the read command R are alternately input will be described. FIG. 6 is a diagram showing one example of a timing chart of the memory access when the write command and the read command R are alternately input in the semiconductor memory 10.

As described above, in the memory access in which the write command W and the read command R are mixed, the SIO mode is preferably selected. In this case, the user inputs, for each write command W and each read command R, the SIO command at the same time that these access commands are input. Then the terminals DQ0 to DQ15 are set to terminals dedicated for transferring data from the host to the memory (writing) and the terminals DQ16 to DQ35 are set to terminals dedicated for transferring data from the memory to the host (reading).

Since data collision does not occur in the SIO mode, there is no need to consider the data turnaround period. Therefore, it is possible to alternately input the write command and the read command at a command cycle speed. The bit width of the input/output terminal in the SIO mode is half the size of that in the CIO mode. Therefore, it may be possible to reduce the width of the bit which is to be operated in the memory cell core, that is, the bit width of the data to be transferred (144 bits in the example of the first embodiment) to half to reduce the current, or to discard excessive data in order to simplify the design.

Figure 7:
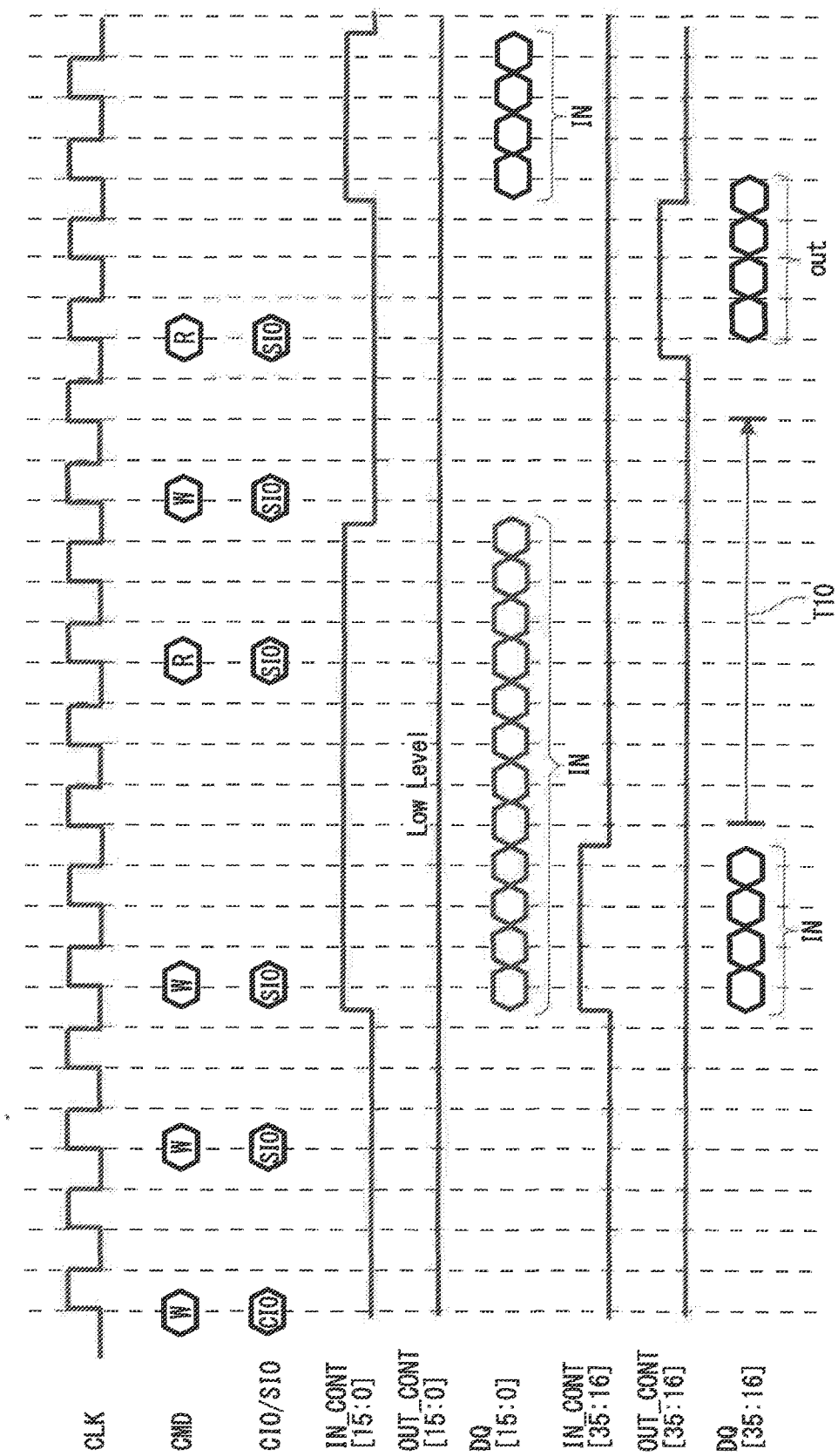
FIG. 7 is a diagram showing one example of a timing chart of the memory access when the read command and the write command are alternately input after the write commands are successively input in the semiconductor memory according to the first embodiment.

Next, an operation of the semiconductor memory 10 when the read command and the write command are alternately input after the write commands are successively input will be described. FIG. 7 is a diagram showing one example of a timing chart of the memory access when the read command R and the write command W are alternately input after the write commands W are successively input in the semiconductor memory 10. In the example shown in FIG. 7, three successive write commands are input, and then the write command, the read command, and the write command are input in this order.

In the example shown in FIG. 7, in the SIO mode, the input/output terminals DQ0 to DQ15 are set to terminals dedicated for transferring data from the host to the memory (writing) and the input/output terminals DQ16 to DQ35 are set to terminals dedicated for transferring data from the memory to the host (reading).

The user stores a queue of the access commands to the memory in the memory controller or the like. By analyzing this queue, it is possible to determine the change in the patterns from the memory access in which the successive write commands are executed to the memory access in which the read command and the write command are alternately executed. The input/output terminal setting command can be set based on this determination.

When the data transfer direction in the input/output terminal DQ is changed, it is required to provide a data turnaround. In FIG. 7, T10 indicates the data turnaround. As shown in FIG. 7, the input/output terminal setting command is switched from the CIO command to the SIO command in the middle of the three successive write commands W.

Specifically, the CIO command is input at the same time that the first write command is input, and the SIO command is input at the same time that the second and third write commands are input. It is therefore possible to provide the data turnaround period required to switch the data transfer direction in the terminal DQ[35:16] while the input of the write data is being executed in the terminal DQ[15:0].

It is therefore possible to switch the setting of the input/output terminal to the setting of the input/output terminal suitable for the memory access in which the read command and the write command are randomly input two command cycles after the third write command.

In Japanese Unexamined Patent Application Publication No. 2008-192264, a technique for switching a connection destination of an address pin by a mode register set (MRS) command and using the address pin to input or output data is proposed. Now, a semiconductor memory that changes setting of the input/output terminal by the MRS command as proposed in Japanese Unexamined Patent Application Publication No. 2008-192264 will be discussed.

FIG. 15 is a timing chart of the memory access when the setting of the input/output terminal DQ is changed by the MRS command when the read command and the write command are alternately input after the write commands are successively input in the semiconductor memory according to the comparative example in which the setting of the input/output terminal is changed by the MRS command.

As shown in FIG. 15, when the input/output terminal DQ is switched by the MRS command, an operation mode switch time T4 occurs. The operation mode switch time T4 typically needs to be several times longer than the data turnaround T3. The MRS command is often set to be 20 cyc or larger in consideration of the time for the reflection to a decoding circuit or a memory after the operation modes are switched so that it is possible to change operation modes of various memories. In a Low Latency (LL) DRAMIII, for example, the operation mode switch time T4 is 24 cyc.

In such a semiconductor memory, if the MRS command is input according to the status of the access to the memory cell, even when the operation mode switch time T4 is short, it is impossible to switch the input/output terminal DQ between SIO and CIO in a time shorter than that of the example described in FIG. 7. As described above, when the MRS command is used, it takes time to switch the modes between the CIO mode and the SIO mode and it is impossible to improve the efficiency in the data bus.

As described above, in the first embodiment, the user can dynamically switch the CIO mode and the SIO mode during the memory access in consideration of the data turnaround. It is therefore possible to enhance the data bus efficiency in different data accesses.

While the example in which the input/output terminal setting command is input at the same time that the access command is input has been described in this embodiment, the present invention is not limited to this example. The input/output terminal setting command may be input after the access command is input but before the data corresponding to this access command is output.

Second Embodiment

In the first embodiment described above, as shown in FIG. 6, the bit width of the input/output data in the SIO mode is half the size of the bit width of the input/output data in the CIO mode, and it is impossible to make the data bus efficiency in the SIO mode 50% or larger. In a second embodiment, an example in which the data bus efficiency in the SIO mode is improved will be described.

Figure 8:
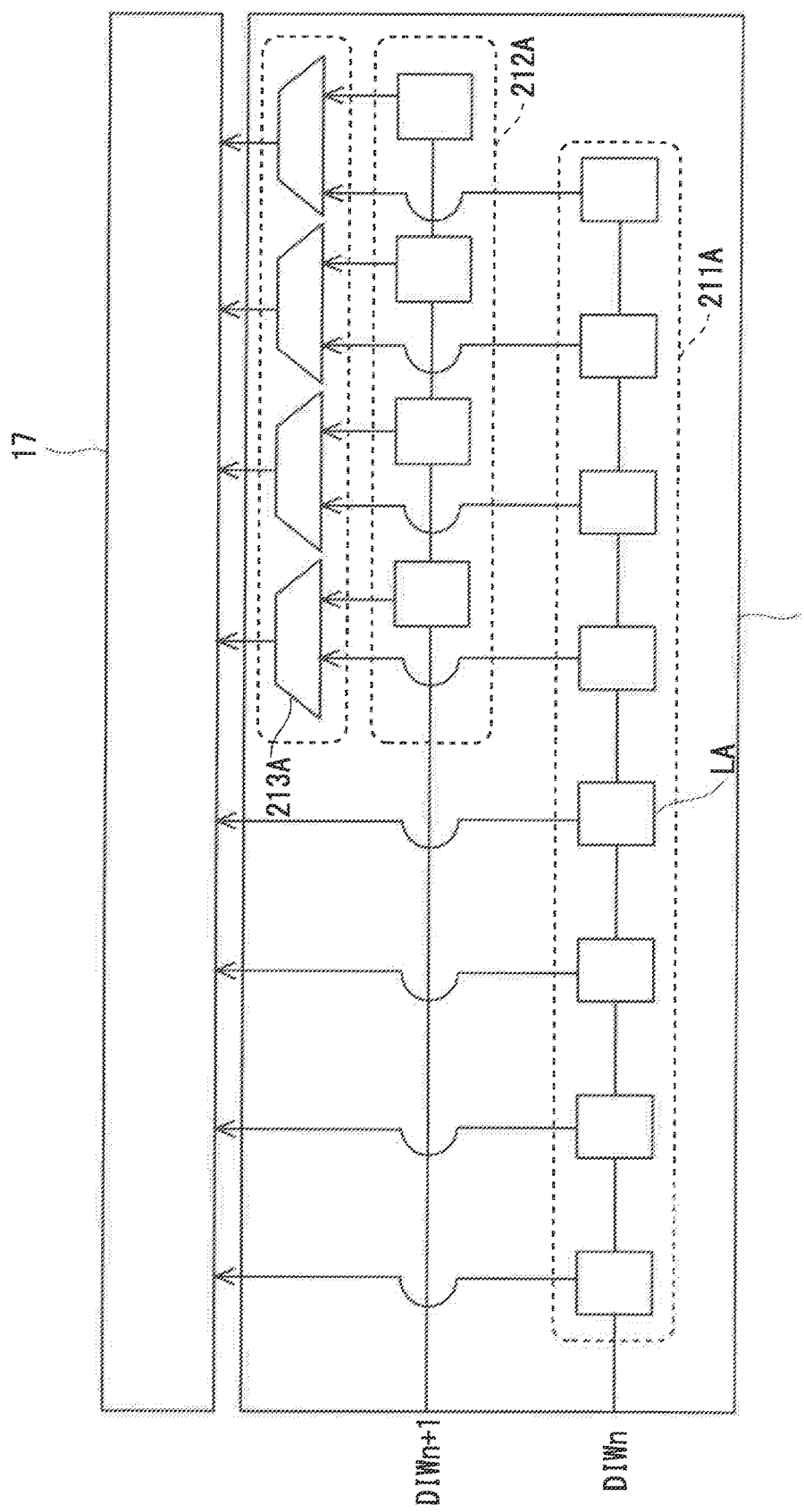
FIG. 8 is a diagram showing a configuration of a data converter circuit of a semiconductor memory according to a second embodiment.

With reference to FIG. 8, a semiconductor memory according to the second embodiment will be described. FIG. 8 is a diagram showing a configuration of a data converter circuit 21A used in the semiconductor memory according to the second embodiment. The data converter circuit 21A shown in FIG. 8 is used in place of the data converter circuit 21 and the data converter circuit 22 shown in FIG. 2. Since the other configurations are similar to those of the first embodiment, descriptions thereof will be omitted.

As shown in FIG. 8, the data converter circuit 21A includes latch circuits 211A and 212A and a multiplexer 213A. The latch circuits 211A and 212A are the tri-state buffer circuit 30 or a series of latch circuits that take the data that has been read out at the rise edge or the fall edge of the clock CLK.

In the example shown in FIG. 8, it is assumed that the specification of the I/F circuit 20 is BL4 in the CIO mode and BL8 in the SIO mode. The latch circuit 211A is a shift register including eight registers connected in series. The latch circuit 212A is a shift register including four registers connected in series.

In the CIO-WR mode, the latch circuits 211A and 212A respectively latch the write data DIWn and DIWn+1 by the external clock and successively transfer the latched data to the subsequent registers. At the time that data has reached the register shown by LA of the latch circuit 211A, data has already been input to all the registers of the latch circuit 212A. At this time, the data latched by the latch circuit 211A is transferred to the memory cell core based on the selection by the column decoder 17. Further, the data latched by the latch circuit 212A is input to the multiplexer 213A. That is, in the CIO-WR mode, the write data is transferred by the four registers of the latch circuit 211A and the four registers of the latch circuit 212A. In the CIO-RD mode, the direction in which the read data in the data converter circuit 21A is transferred becomes opposite to the direction in which the write data is transferred.

In the SIO-WR mode, only DIWn is input and DIWn+1 is not input. Therefore, only the write data DIWn is successively transferred among the registers in the latch circuit 211A. At this time, the latch circuit 212A stops the latch operation. At the time that the write data DIWn has been input to all the registers of the latch circuit 211A, the write data that is input to the register shown in LA and to the registers provided before the register LA is input to the multiplexer 213A. Further, the write data input to the registers provided subsequent to LA is transferred to the memory cell core based on the selection by the column decoder 17. That is, in the SIO-WR mode, the write data is transferred by the eight registers that constitute the latch circuit 211A and the write data is not transferred in the latch circuit 212A. Therefore, the number of pieces of data transferred in the CIO-WR mode and the number of pieces of data transferred in the SIO-WR mode are equal to each other. In the SIO-RD mode, the direction in which the read data in the data converter circuit 21 is transferred becomes opposite to the direction in which the write data is transferred.

In the CIO-WR mode, the write data is input to the multiplexer 213A from the latch circuit 212A and in the SIO-WR mode, the write data is input to the multiplexer 213A from the latch circuit 211A. The multiplexer 213A transfers the write data input from one of the latch circuits 211A and 212A to the memory cell core based on the selection by the column decoder 17. The multiplexer 213A is controlled by the CIO-WR command or the SIO-WR command output from the logic circuit 13.

That is, the latch circuit 212A is a first latch circuit that holds data input or output via the CIO in a first burst length. Further, the latch circuit 211A is a second latch circuit that holds data input or output via the SIO in a second burst length, which is twice as long as the first burst length. Further, the burst length of the data input or output when the SIO is selected is longer than the burst length of the data input or output when the CIO is selected. In the example shown in the second embodiment, the burst length of the data input or output when the SIO is selected becomes twice as long as the burst length of the data input or output when the CIO is selected.

Figure 9:
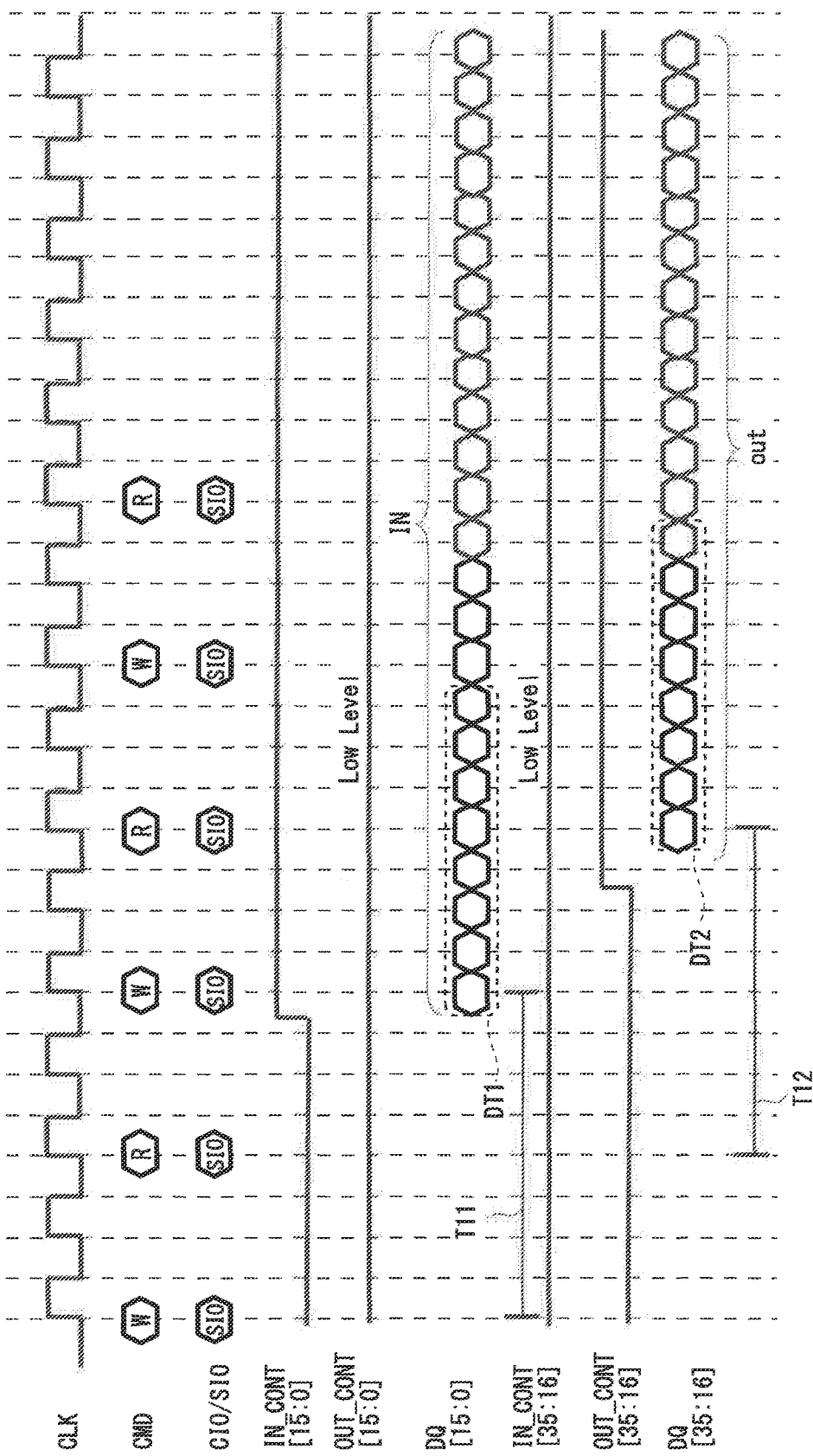
FIG. 9 is a diagram showing one example of a timing chart of a memory access when a read command and a write command are alternately input in the semiconductor memory according to the second embodiment.

FIG. 9 is a diagram showing one example of a timing chart of the memory access when the read command and the write command are alternately input in the semiconductor memory according to the second embodiment. As stated above, when the read command and the write command are alternately input, the SIO mode is selected.

In the first embodiment, the number of terminals used to input or output data in the SIO mode is half the number of terminals used to input or output data in the CIO mode. That is, the number of bits of the data transferred to the memory cell core 15 in the SIO mode is half the number of bits of the data transferred to the memory cell core 15 in the CIO mode. It is impossible to transfer the write data and the read data to each input/output terminal DQ at the identical clock. Therefore, the data bus efficiency becomes lower than 50%.

On the other hand, in the second embodiment, the burst length (BL) in the SITO mode is set twice as long as the BL in the CIO mode. That is, the number of pieces of data for one command in the CIO mode can be made equal to the number of pieces of data for one command in the SIO mode. In FIG. 9, the write data for the first write command W is referred to as a DT1 and the read data for the next read command R is referred to as a DT2. After an elapse of a predetermined latency T11 after the input of the first write command W, the write data DT1 in the BL8 is transferred to the memory cell core 15 from the host via the input/output terminals DQ0 to DQ15.

The read command R is input in the next command cycle and the read data DT2 in the BL8 is transferred to the host from the memory cell core 15 via the input/output terminals DQ16 to DQ35 after a latency T12, which has a length the same as that of the latency T11. Since the BL in the SIO mode is 8, data is input or output in 8 DDR clocks (i.e., the rise edge and the fall edge of four clocks).

As shown in FIG. 9, from the fourth DDR clock of the clock in which the write data DT1 in response to the first write command W is input, the read data DT2 for the next read command is output. That is, the data transfer in the latter part of the write data DT1 and the data transfer in the former part of the read data DT2 are performed in parallel. As described above, by setting the burst length of the data input or output when the SIO is selected twice as large as the burst length of the data input or output when the CIO is selected, the data bus efficiency in the SIO mode can be improved to 100%.

Figure 10:
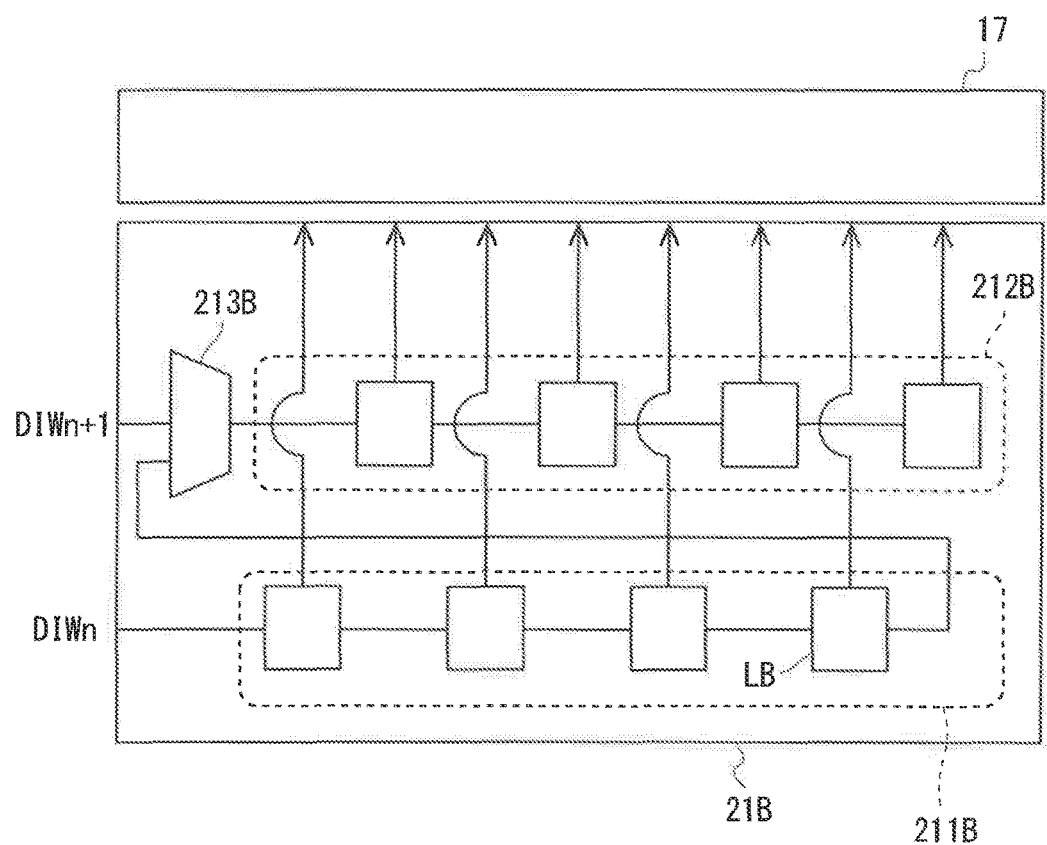
FIG. 10 is a diagram showing another configuration of a data converter circuit of the semiconductor memory according to the second embodiment.

FIG. 10 shows a configuration of another data converter circuit 21B used in the semiconductor memory according to the second embodiment. The data converter circuit 21B shown in FIG. 10 is used in place of the data converter circuit 21 and the data converter circuit 22 shown in FIG. 2. Since the other configurations are similar to those in the first embodiment, descriptions thereof will be omitted.

As shown in FIG. 10, the data converter circuit 21B includes a latch circuit 211B, a latch circuit 212B, and a multiplexer 213B. The latch circuits 211B and 212B are the tri-state buffer circuit 30 or a series of latch circuits that take the data that has been read out at the rise edge or the fall edge of the clock CLK.

In the example shown in FIG. 10, it is assumed that the specification of the I/F circuit 20 is BL4 in the CIO mode and BL8 in the SIO mode. The latch circuits 211B and 212B are shift registers each including four registers connected in series.

The multiplexer 213B is a selection circuit that selects one of the write data DIWn+1 and the write data transferred from the latch circuit 211B based on the input/output terminal setting command and outputs the selected data to the latch circuit 212B. The multiplexer 213B is controlled by the CIO-WR command, the SIO-WR command or the like output from the logic circuit 13.

In the CIO-WR mode, in the multiplexer 213B, the write data DIWn+1 input from the tri-state buffer circuit 30 is selected. The latch circuits 211B and 212B respectively latch the write data DIWn and DIWn+1 by the external clock and successively transfer the write data DIWn and DIWn+1 to the subsequent registers. At the time that data has reached the register shown by the LB of the latch circuit 211B, the data latched by the latch circuits 211B and 212B is transferred to the memory cell core based on the selection by the column decoder 17. In the CIO-RD mode, the direction in which the read data in the data converter circuit 21A is transferred becomes opposite to the direction in which the write data is transferred.

In the SIO-WR mode, only the write data DIWn is input and the write data DIWn+1 is not input. The multiplexer 213B selects the write data transferred from the latch circuit 211B. In the example shown in FIG. 10, the write data DIWn in the BL8 is successively transferred among the registers in the latch circuit 211B. After all the registers of the latch circuit 211B are filled with data, the write data DIWn is successively transferred to the registers of the latch circuit 212B via the multiplexer 213B.

At the time that the write data DIWn has reached all the registers of the latch circuits 211B and 212B, the write data that has been latched is transferred to the memory cell core via the bit line selected by the column decoder 17. That is, the write data DIWn in the BL8 is held by the latch circuit 211B and the latch circuit 212i. As described above, it is possible to make the BL in the SIO mode longer than the BL in the CIO mode without increasing the number of registers, whereby it is possible to prevent an increase in the size of the semiconductor memory.

Since the BL is 8 in the SIO mode in the second embodiment, when the identical access commands are successive, the next access command is input 8 DDR clocks after the previous access command is input. That is, the interval between the access commands is determined by the BL. However, when the write command and the read command are alternately input as shown in FIG. 9, the access command is input for each 4 DDR clocks. That is, between the identical access commands, another access command can be inserted.

In the second embodiment as well, the input/output terminal setting command may be input in a specific latency with respect to the input of the access command. That is, the input/output terminal setting command is input after the access command is input but before the data corresponding to this access command is input or output. It is possible to input, for example, the input/output terminal setting command one clock later than the write command. The timing when the input/output terminal setting command is input can be flexibly set depending on various conditions.

Further, while the logic circuit 13 separately outputs the access command and the input/output terminal setting command in the first and second embodiments stated above, one command in which the access command and the input/output terminal setting command are mixed in advance may be set and this command may be output to the column decoder 17 and the I/F circuit 20. That is, the logic circuit 13 may output the SIO-RD command, the SIO-WR command, the CIO-RD command, and the CIO-WR command to both the column decoder 17 and the I/F circuit 20.

Third Embodiment

Figure 11:
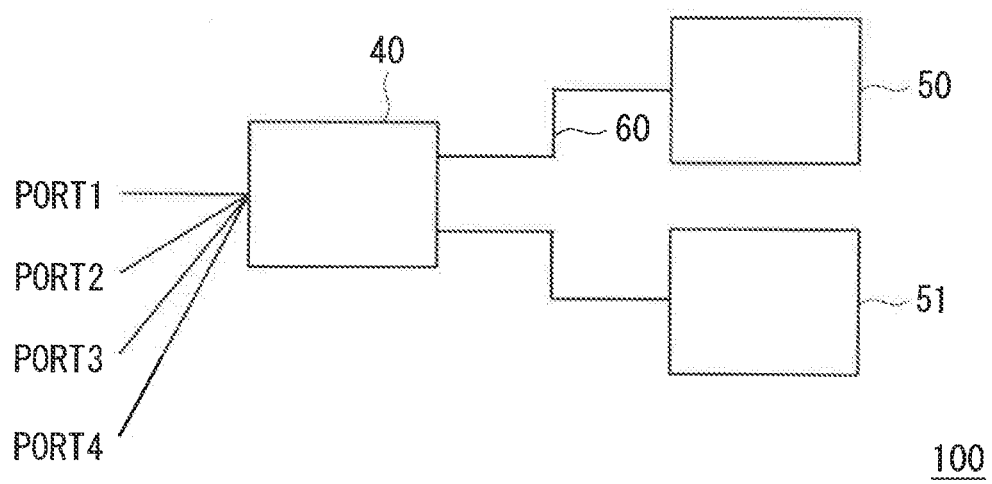
FIG. 11 is a diagram showing a configuration of a memory system according to a third embodiment.

A memory system using the semiconductor memory 10 according to the above embodiments will be described. FIG. 11 is a diagram showing a configuration of a memory system 100 according to a third embodiment. FIG. 11 is an example in which the semiconductor memory 10 is applied to a network switch. As shown in FIG. 11, the memory system 100 includes an application specific integrated circuit (ASIC) 40, a buffer memory 50, and a search memory 51. The ASIC 40, the buffer memory 50, and the search memory 51 are connected to one another via a bus 60.

The semiconductor memory 10 described in the first and second embodiments is used as the buffer memory 50. The search memory 51 may be the semiconductor memory 10 described in the first and second embodiments or may be a ternary content addressable memory (TCAM) as long as the I/F is the same as the memory described in the first and second embodiments. In the following description, the example in which the TCAM is used as the search memory 51 will be described.

The ASIC 40 includes a plurality of ports PORT1 to PORT 4 through which packets are input. In the memory system 100, the packet input through a specific port of the ASIC 40 is temporarily stored in the buffer memory 50. Next, the destination address of the packet is searched by the search memory 51 and the destination data is acquired. The packet stored in the buffer memory 50 is output to a predetermined port based on the destination data.

The search memory 51 holds storage data by a plurality of entries formed of a plurality of CAM cells (not shown). Each entry has an address. The search memory 51 accepts packets and, in parallel for the respective entries, determines whether each entry of storage data matches the packet. Each CAM cell of the search memory 51 may have three values of "high", "low", and "don't care". When there is an entry in which the input packet is consistent with the storage data, the destination data based on the consistent data is output.

Further, the search memory 51 may have the CIO mode and the SIO mode, similar to the buffer memory 50.

Figure 12:
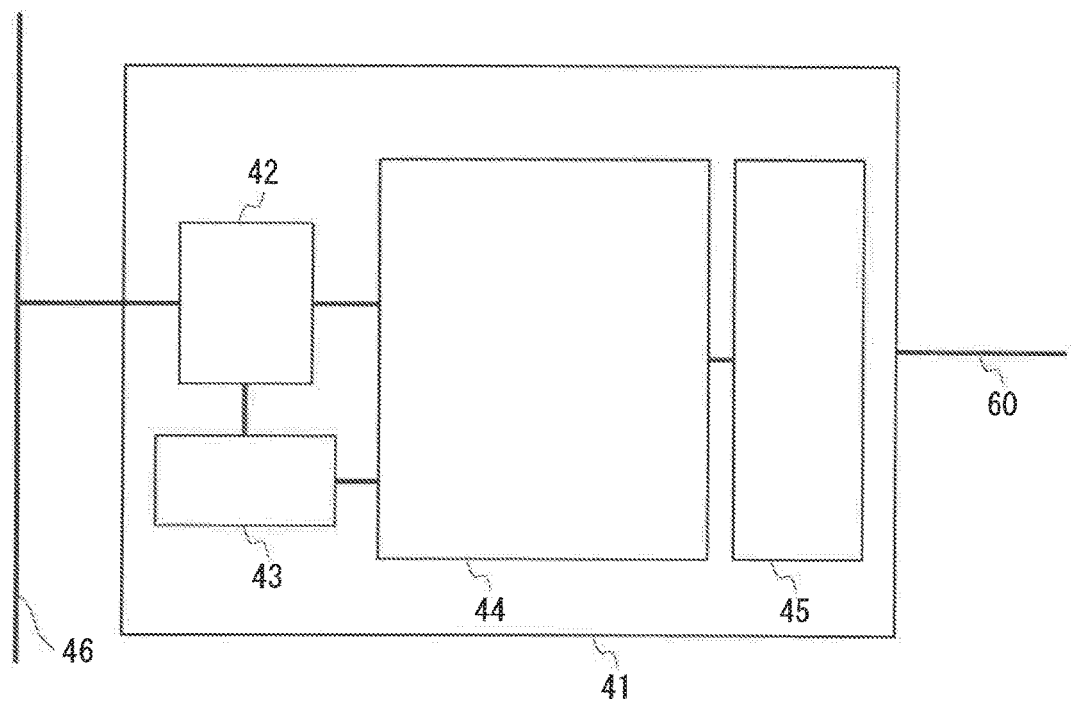
FIG. 12 is a diagram showing a configuration of an ASIC of the memory system shown in FIG. 11.

The ASIC 40 includes a memory controller that controls the buffer memory 50 and the search memory 51. FIG. 12 is a diagram showing a configuration of the memory controller 41 embedded in the ASIC 40 in FIG. 11. As shown in FIG. 12, the memory controller 41 includes a First-In First-Out (FIFO) 42, a command monitor circuit 43, a memory control logic circuit 44, and a physical layer (PHY) 45.

The memory controller 41 generates an access command for the buffer memory 50 and an access command for the entry of the search memory 51. Further, the memory controller 41 outputs the input/output terminal setting command that switches the input/output terminal of the buffer memory 50 to one of the CIO and the SIO at the same time that the access command is input. Further, the memory controller 41 outputs the input/output terminal setting information of the search memory 51 at the same time that the access command for the entry of the search memory 51 is input. The search memory 51 receives the input/output terminal setting information for each access command and switches the CIO and the SIO according to the timing when the data is input or output.

The memory controller 41 is connected to an internal logic of the ASIC 40 via an internal bus 46. The Advanced Microcontroller Bus Architecture (AMBA) bus manufactured by ARM Ltd. or the like may be used, for example, as the internal bus 46.

The FIFO 42 is a buffer circuit that stores the access commands for the buffer memory 50 input from the internal logic and outputs the access commands to the memory control logic circuit 44 in the order in which they have been input. The memory control logic circuit 44 rearranges the access commands that have been input to improve the access characteristics to the buffer memory 50. In the case of the DRAM, the memory control logic circuit 44 regularly inserts the refresh command between the access commands. The FIFO 42 is used to absorb the control time that is generated when these controls in the memory control logic circuit 44 are performed.

The command monitor circuit 43 monitors the access commands stored in the FIFO 42. Specifically, the command monitor circuit 43 checks the arrangement or the frequency of the write command and the read command in the access commands and determines whether to set the input/output terminal DQ of the I/F circuit 20 to the CIO or the SIO for each access command.

When the write commands or the read commands are successive, for example, the command monitor circuit 43 issues a CIO command to set the input/output terminal DQ to the CIO. Further, when the write command and the read command are alternately generated, the command monitor circuit 43 issues an SIO instruction to set the input/output terminal DQ to the SIO and outputs the SIO instruction to the memory control logic circuit 44. The memory control logic circuit 44 generates the input/output terminal setting command according to the CIO instruction or the SIO instruction.

The PHY 45 is an interface between the memory controller 41 and the bus 60 and typically corresponds to a physical layer controller. The PHY 45 transfers the access command from the memory control logic circuit 44 to the buffer memory 50 and the search memory 51 and transfers the input/output terminal setting command.

Since the packet stored in the buffer memory 50 is frequently updated, the write operation and the read operation are mixed in the access to the buffer memory 50. This causes degradation in the performance of the memory system 100. In the third embodiment, however, the command monitor circuit 43 that monitors the access commands is provided in the ASIC 40 connected to the bus 60. By switching the mode of the buffer memory 50 between the CIO mode and the SIO mode for each access command by the command monitor circuit 43, it is possible to improve the efficiency in the data bus and to improve the performance of the whole memory system 100. Further, since the destination data stored in the search memory 51 is occasionally updated, it is possible to improve the efficiency in the data bus as well.

As described above, in the memory access in which the user frequently switches the access commands, the SIO mode in which the data turnaround does not occur is selected and in the memory access in which the identical access commands are successive, the CIO mode in which all the bus areas can be used in one direction is selected, whereby the bus efficiency can be improved.

While the invention made by the present inventors has been specifically described based on the embodiments, it is needless to say that the present invention is not limited to the embodiments stated above and may be changed in various ways without departing from the spirit of the present invention.

The above embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor memory, comprising:
a plurality of data terminals for transmitting data;
a plurality of buffer circuits, each being coupled to a corresponding one of the data terminals; and
a control circuit receiving an access command, that control reading data from a memory cell array or writing data to the memo, cell array, and a terminal setting information issued with each access command, and controlling the buffer circuits based on the access command and the terminal setting information,
wherein, when the terminal setting information indicates a first mode, all of the buffer circuits function as either all input buffer circuits or all output buffer circuits based on the access command, and
wherein, when the terminal setting information indicates second mode, a part of the buffer circuits functions as the input buffer circuits and a remaining part of the buffer circuits functions as the output buffer circuits.

2. The semiconductor memory according to claim 1, wherein the buffer circuits comprise tri-state buffer circuits.

3. The semiconductor memory according to claim 1, wherein the terminal setting information is issued within a period from issuing the access command to issuing or receiving data corresponding to the access command.

4. The semiconductor memory according to claim 1, wherein the terminal setting information and the access command are issued at a same time.

5. The semiconductor memory according to claim 1, wherein a burst length of data input or output when the terminal setting information indicates the second mode is longer than a burst length of data input or output when the terminal setting information indicates the first mode.

6. A memory system, comprising:
a memory controller that receives an access command, that controls reading data from a memory or writing data to the memory, and generates terminal setting information for each access command; and
a memory including:
  a plurality of data terminals for transmitting data;
  a plurality of buffer circuits, each being coupled to a corresponding one of the data terminals; and
  a control circuit receiving the access command and the terminal setting information issued with each access command from the memory controller, and controlling the buffer circuits based on the access command and the terminal setting information,
wherein, when the terminal setting information indicates a first mode, all of the buffer circuits function as either all input buffer circuits or all output buffer circuits based on the access command, and
wherein, when the terminal setting information indicates a second mode, a part of the buffer circuits function as the input buffer circuits and remaining part of the buffs circuits functions as the output buffer circuits.

7. The memory system according to claim 6, wherein the memory controller further comprises a command monitor unit that generates the terminal setting information based on the received access command.

* * * * *